(12) United States Patent
El-Barbari et al.

(10) Patent No.: US 10,024,898 B2
(45) Date of Patent: Jul. 17, 2018

(54) SYSTEM AND METHOD FOR DETERMINING INDUCTANCE IN A POWER CONVERTER

(71) Applicant: General Electric Company, Schenectady, NY (US)

(72) Inventors: Said Farouk El-Barbari, Munich (DE); Alvaro Jorge Mari Curbelo, Munich (DE); Simon Herbert Schramm, Moosach (DE)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 90 days.

(21) Appl. No.: 15/191,556

(22) Filed: Jun. 24, 2016

(65) Prior Publication Data

US 2017/0370977 A1   Dec. 28, 2017

(51) Int. Cl.
  *G01R 27/26* (2006.01)
  *G01R 15/18* (2006.01)

(52) U.S. Cl.
  CPC .......... *G01R 27/2611* (2013.01); *G01R 15/18* (2013.01)

(58) Field of Classification Search
  CPC ........................... G01R 27/2611; G01R 15/18
  USPC ................................................. 324/654–657
  See application file for complete search history.

(56) References Cited

U.S. PATENT DOCUMENTS

| 5,027,264 A | 6/1991 | Dedoncker et al. |
| 5,481,449 A | 1/1996 | Kheraluwala et al. |
| 7,352,596 B2 | 4/2008 | Cheng |
| 8,587,975 B2 | 11/2013 | Jain et al. |
| 2002/0038191 A1* | 3/2002 | Ko .......................... G01R 31/06 702/117 |
| 2006/0074405 A1* | 4/2006 | Malackowski .... A61B 17/1613 606/1 |
| 2008/0272748 A1* | 11/2008 | Melanson ........... H02M 1/4225 323/207 |
| 2011/0249472 A1* | 10/2011 | Jain ................... H02M 3/33584 363/15 |

(Continued)

OTHER PUBLICATIONS

Jahromi et al. "A Fast Method for Calculation of Transformers Leakage Reactance Using Energy Technique", International Journal of Engineering, vol. 16, 41-48, Apr. 2003.

(Continued)

*Primary Examiner* — Jeff Natalini
(74) *Attorney, Agent, or Firm* — GE Global Patent Operation; Pabitra Chakrabarti (57) ABSTRACT

A system includes a power converter including a primary bridge unit to receive a primary voltage from a voltage source, the primary bridge unit includes a first plurality of electronic switches, and each of the first plurality of electronics switches has a turn ON time and a turn OFF time. Further, the power converter includes a transformer including a primary winding and a secondary winding, the primary winding is coupled to the first plurality of electronic switches. Also, the power converter includes a secondary bridge unit including a second plurality of electronic switches coupled to the secondary winding. Additionally, the system includes a controller to determine an inductance of the power converter based on the primary voltage, the turn ON time of the first plurality of electronic switches, a switching cycle time of the power converter, and one of an average current and a peak current in the power converter.

24 Claims, 3 Drawing Sheets

(56) References Cited

U.S. PATENT DOCUMENTS

2014/0218978 A1* 8/2014 Heuken ............ H02M 3/33523
363/21.16
2014/0334195 A1 11/2014 Nussbaum et al.

OTHER PUBLICATIONS

Peng et al. "Research on Monitoring of Winding Deformation of Power Transformer by On-line Parameter Estimation about Leakage Inductance", Power System Technology, 2006. PowerCon 2006. International Conference on, pp. 1-6, Oct. 2006.
Wilson et al. "Effective Modeling of Leakage Inductance for use in Circuit Simulation", Applied Power Electronics Conference and Exposition, 2008. APEC 2008. Twenty-Third Annual IEEE, pp. 391-395, Feb. 2008.
Cougo et al. "Integration of Leakage Inductance in Tape Wound Core Transformers for Dual Active Bridge Converters", Integrated Power Electronics Systems (CIPS), 2012 7th International Conference on, pp. 1,6, Mar. 6-8, 2012.
Thondapu et al. "Improved Expression for Estimation of Leakage Inductance in E Core Transformer Using Energy Method", Advances in Power Electronics, vol. 2012, Article ID 635715, 6 pages, Apr. 2012.

\* cited by examiner

SYSTEM AND METHOD FOR DETERMINING INDUCTANCE IN A POWER CONVERTER

BACKGROUND

Embodiments of the present specification relate generally to power converters, and more particularly to systems and method for determining an effective inductance in the power converters.

A power converter is typically employed to interface a power source to one or more electric loads. In particular, the power converter is used to control flow of power from the power source to the one or more electric loads. Generally, the power converter has a primary side and a secondary side, where each side includes solid state switches. These solid state switches are used to rapidly and/or intermittently interrupt or commutate an input current from the power source so as to effectuate conversion of the input current to an output current having different amplitudes and/or frequencies at the one or more electric loads. In one example, the power converter may be a direct current (DC) power converter that produces an output power at a substantially constant output voltage and/or current.

Furthermore, the primary and secondary sides of the power converter are magnetically coupled to each other via use of one or more magnetic components. In one example, the magnetic components may be a primary winding and a secondary winding of a transformer. In general, the power converter is operated at higher switching frequencies to reduce the size of the magnetic components in the power converter. However, at higher switching frequencies, parasitic elements such as leakage inductance of the magnetic components or any interconnecting cables may become more dominant and may result in a higher voltage drop and a lower power output from the converter. Therefore, it is desirable to determine an effective inductance in the power converter to control the current and to estimate a potential power output of the power converter.

In a conventional power converter, an estimate of the inductance value is typically provided by a component manufacturer. This estimated inductance value is used for determining the potential power output of the power converter. For example, if a transformer is used in the power converter, the estimated inductance value provided by the manufacturer is indicative of the inductance of the transformer in the power converter. However, the power converter may include other parasitic components that cause the effective inductance in the power converter to be different from the estimated inductance value. Some examples of the parasitic components include electrical cables that are used for coupling the solid state switches in the primary and secondary sides of the converter to the transformer to facilitate transfer of electrical power from the power source to the electric load. As the switching frequency in the power converter increases, the value of the voltage drop across the parasitic components also increases. By way of example, as the power converters are built with wide bandgap semiconductors like silicon carbide (SiC), the voltage drop across these semiconductors may be higher when compared to the voltage drop in classical semiconductors like Si. In certain situations, this voltage drop across these semiconductors may have values that can no longer be neglected. This voltage drop may in turn result in an additional power drop in the potential power output of the power converter.

BRIEF DESCRIPTION

In accordance with aspects of the present specification, a system for determining an inductance of a power converter is presented. The system includes a power converter including a primary bridge unit coupled to a voltage source and configured to receive a primary voltage from the voltage source, where the primary bridge unit includes a first plurality of electronic switches, and where each of the first plurality of electronics switches has a determined turn ON time and a determined turn OFF time. Further, the power converter includes a transformer including a primary winding and a secondary winding, where the primary winding is coupled to the first plurality of electronic switches in the primary bridge unit. Also, the power converter includes a secondary bridge unit including a second plurality of electronic switches coupled to the secondary winding of the transformer. In addition, the system includes a controller configured to determine an inductance of the power converter based on the primary voltage, the determined turn ON time of the first plurality of electronic switches, a switching cycle time of the power converter, and one of an average current and a peak current in the power converter.

In accordance with another embodiment of the present specification, a method for determining an inductance of a power converter is presented. The method includes receiving, by a primary bridge unit, a primary voltage from a voltage source, where the primary bridge unit includes a first plurality of electronic switches having a determined turn ON time and a determined turn OFF time. Also, the method includes determining, by a controller, an inductance of the power converter based on the primary voltage, the determined turn ON time of the first plurality of electronic switches, a switching cycle time of the power converter, and one of an average current and a peak current in the power converter.

In accordance with another embodiment of the present specification, a system is presented. The system includes a power converter. Also, the system includes a controller coupled to the power converter and configured to: determine an inductance of the power converter corresponding to each of a determined number of switching cycle times; estimate an average inductance based on the inductance corresponding to each of the determined number of the switching cycle times; compare the estimated average inductance with a normal operating range of the power converter; and trigger an error signal based on the comparison, where the error signal is an indicator of health of the power converter.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As will be described in detail hereinafter, various embodiments of exemplary systems and methods for determining an effective inductance of a power converter are presented. In particular, the systems and methods presented herein aid in determining the effective inductance of the power converter during a start-up mode and/or a normal mode of the power converter. The determined effective inductance of the power converter may aid in estimating appropriate switching times of solid state switches in the power converter. The estimated switching times of solid state switches may in turn be used to adjust potential power output of the power converter. In addition, a value of the effective inductance is determined at different instances of time and stored internally. Moreover, these values of effective inductance of the power converter may be used to generate a health indicator of the effective inductance.

Figure 1:
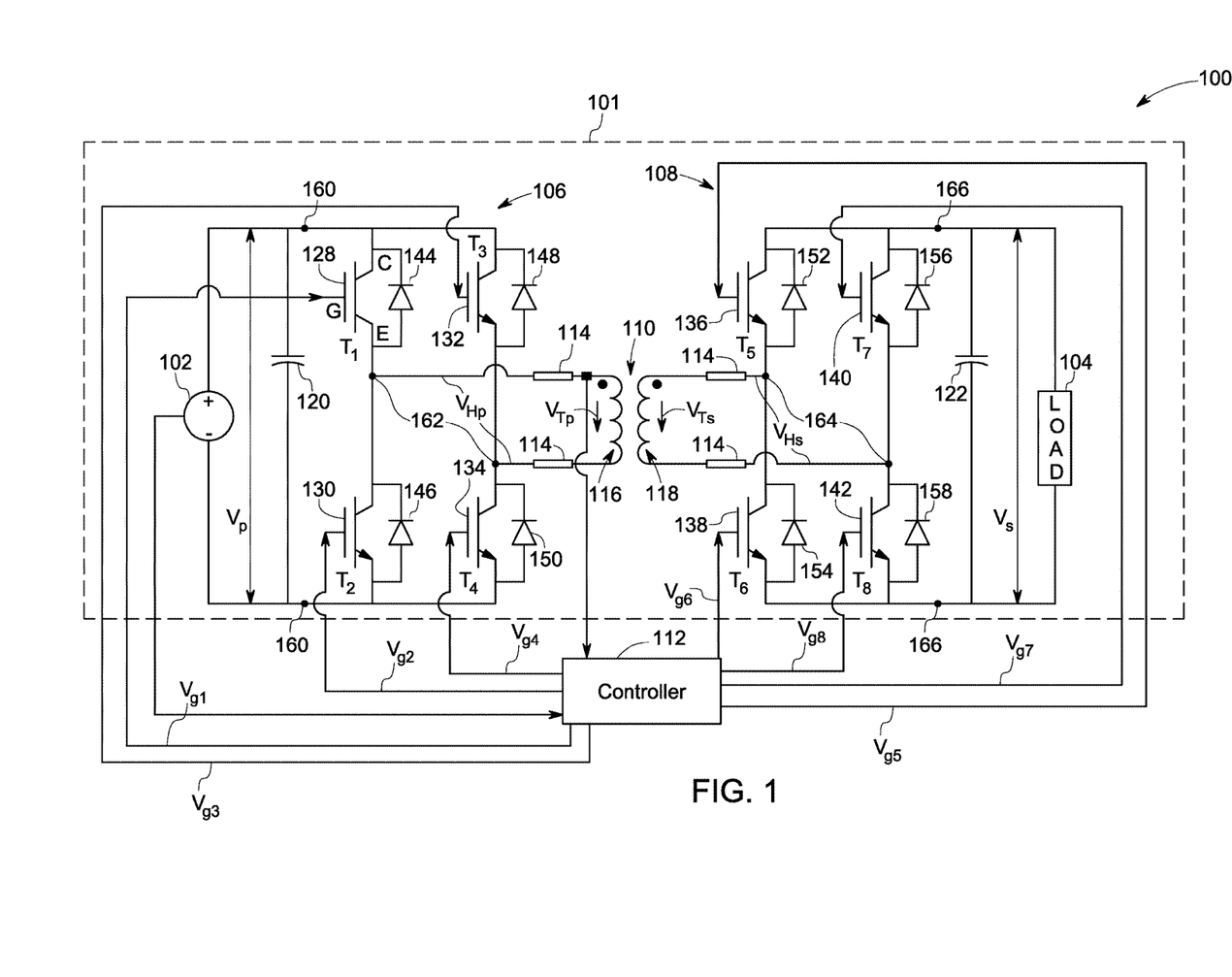
FIG. 1 is a schematic diagram of a system for determining an effective inductance in a power converter, in accordance with aspects of the present specification.

Turning now to the drawings and referring to FIG. 1, a schematic diagram of a system 100, for determining an effective inductance in a power converter 101, in accordance with aspects of the present specification, is depicted. It may be noted that the terms "effective inductance" and "inductance" may be used interchangeably in the following description. The power converter 101 may be used to interface two isolated direct current (DC) links, where one of the DC links may be coupled to a voltage source 102, while the other DC link may be coupled to an electric load 104. In one example, the voltage source 102 may be a DC voltage source, while the electric load 104 may be one or more power consuming units/devices. It may be noted that the electric load 104 may include other loads such as DC-AC converters that drive electrical motors, and is not limited to the power consuming units/devices.

Further, the power converter 101 may be arranged in a dual active bridge (DAB) topology to provide an adjustable bi-directional power flow between the two isolated DC links over a broad range of voltage ratios. As will be appreciated, the voltage ratio is a ratio of an input voltage to an output voltage. In the embodiment of FIG. 1, the input voltage is a primary voltage $V_p$ across the voltage source 102, while the output voltage is a secondary voltage $V_s$ across the electric load 104 of the power converter 101. It may be noted that the power converter 101 may be arranged in other types of topologies, and is not limited to DAB topology depicted in FIG. 1.

Also, the power converter 101 may be a switching power converter that may be switched between a plurality of switching states to interrupt and/or commutate an input current from the voltage source 102 to the electric load 104. Moreover, the power converter 101 may operate at a determined switching frequency to control the secondary voltage $V_s$ across the electric load 104 and the power flow from the voltage source 102 to the electric load 104. In one example, the power converter 101 may operate at a switching frequency that is in a range from about 400 Hz to about 20 kHz.

In a presently contemplated configuration, the power converter 101 includes a primary bridge unit 106, a secondary bridge unit 108, a transformer 110, a controller 112, and one or more electrical cables 114. The primary bridge unit 106 and the secondary bridge unit 108 are coupled to the transformer 110 via one or more electrical cables 114. As depicted in FIG. 1, the primary bridge unit 106 includes a first plurality of switches. The first plurality of switches includes a first electronic switch $T_1$ 128, a second electronic switch $T_2$ 130, a third electronic switch $T_3$ 132, and a fourth electronic switch $T_4$ 134. These electronic switches 128, 130, 132, 134 are coupled to each other to form a hybrid (H)-bridge circuit. Further, input terminals 160 of the primary bridge unit 106 are coupled to the voltage source 102, while output terminals 162 of the primary bridge unit 106 are coupled to a primary winding 116 of the transformer 110 via the electrical cables 114. The primary bridge unit 106 is configured to receive a primary DC voltage $V_p$ from the voltage source 102 at the input terminals 160 and provide a primary bridge voltage $V_{Hp}$ at the output terminals 162. Also, the voltage across the primary winding 116 is represented as $V_{Tp}$.

In a similar manner, the secondary bridge unit 108 includes a second plurality of electronic switches, such as a fifth electronic switch $T_5$ 136, a sixth electronic switch $T_6$ 138, a seventh electronic switch $T_7$ 140, and an eighth electronic switch $T_8$ 142. These electronic switches 136, 138, 140, 142 are coupled to each other to form an H-bridge circuit. Further, input terminals 164 of the secondary bridge unit 108 are coupled to a secondary winding 118 of the transformer 110 via the electrical cables 114, while output terminals 166 of the secondary bridge unit 108 are coupled to the electric load 104. The secondary bridge unit 108 is configured to receive a secondary bridge voltage $V_{Hs}$ at the input terminals 164 and provide a secondary voltage $V_s$ across the output terminals 166. Also, the voltage across the secondary winding 118 is represented as $V_{Ts}$.

Further, each of the electronic switches $T_1$-$T_8$ 128-142 may be a solid state switch with terminals, such as a collector C, a gate G, and an emitter E. In one example, the electronic switches $T_1$-$T_8$ 128-142 may be Insulated Gate Bipolar Transistors (IGBTs). Also, each of the electronic switches $T_1$-$T_8$ 128-142 may have a corresponding freewheeling diode 144, 146, 148, 150, 152, 154, 156, 158, which is connected in an anti-parallel configuration across the collector C and the emitter E of the respective electronic switch. It may be noted that the terms "electronic switches" and "solid state switches" may be used interchangeably in the following description.

Moreover, the electronic switches $T_1$-$T_8$ 128-142 may have a predetermined turn ON time and turn OFF time. The turn ON time may be representative of a time period in which the electronic switches $T_1$-$T_8$ 128-142 are activated. Similarly, the turn OFF time may be representative of a time period in which the electronic switches $T_1$-$T_8$ 128-142 are deactivated. It may be noted that the terms "turn ON" and "activated" may be used interchangeably. Also, it may be noted that the terms "turn OFF" and "deactivated" may be used interchangeably.

Furthermore, the controller 112 interacts with each of the electronic switches $T_1$-$T_8$ 128-142 in the primary bridge unit 106 and the secondary bridge unit 108. Also, the controller 112 is configured to control the turn ON time and/or the turn OFF time of the electronic switches $T_1$-$T_8$ 128-142. Particularly, the controller 112 may transmit trigger voltages $V_{g1}$, $V_{g2}$, $V_{g3}$, $V_{g4}$, $V_{g5}$, $V_{g6}$, $V_{g7}$, $V_{g8}$ in a determined timing pattern to the electronic switches $T_1$-$T_8$ 128-142 to turn ON or turn OFF the corresponding electronic switches $T_1$-$T_8$ 128-142 in the power converter 101. The turn ON time and turn OFF time of the electronic switches $T_1$-$T_8$ 128-142 are predetermined and stored in the controller 112. In one example, the turn ON time and turn OFF time may be computed to ensure that a current in the electronic switches $T_1$-$T_8$ 128-142 has a zero value at the end of each switching cycle time T.

Also, the primary bridge voltage $V_{Hp}$ at the output terminals 162 of the primary bridge unit 106 may be phase shifted from the secondary bridge voltage $V_{Hs}$ at the input terminals 164 of the secondary bridge unit 108 to control the flow of power in the power converter 101. In certain embodiments, this phase shift may be determined based on the demand for power at the electric load 104. By way of example, this phase shift may be determined such that the value of the phase shift facilitates transfer of a maximum value of power to the electric load 104 without affecting/stressing the components in the power converter 101. This maximum value of power will hereinafter be referred to as a potential power output of the power converter 101.

In a conventional system, a controller may use an inductance value of the power converter provided by a manufacturer to estimate a potential power output of the power converter. However, this inductance value may vary due to manufacturing tolerances and/or parasitic inductance of one or more electrical cables in the power converter. Moreover, the increase in the switching frequency of the power converter results in an increase in the voltage drop across the leakage and/or parasitic components and may cause an additional power drop in the potential power output of the power converter.

The exemplary power converter of FIG. 1 is configured to circumvent the shortcomings of the presently available power converters. In particular, the controller 112 is configured to determine an effective inductance in the power converter 101 during operation of the power converter 101. The effective inductance may be representative of a total inductance in the power converter including a leakage inductance of the transformer and a parasitic inductance of one or more parasitic components in the power converter 101. Also, the power converter 101 may be operated in a start-up mode or in a normal mode. The start-up mode may be representative of a mode of the power converter 101 where the secondary winding 118 of the transformer 110 is short-circuited and the electric load 104 is isolated from the secondary bridge unit 108. Similarly, the normal mode may be representative of a mode of the power converter 101 where the secondary winding 118 of the transformer 110 is electrically coupled to the electric load 104 via the secondary bridge unit 108.

During the operation of the power converter 101, the controller 112 is configured to determine the effective inductance based on one of a peak current and an average current in the power converter 101. The controller 112 may determine the effective inductance L in the power converter 101 corresponding to one switching cycle time T of the power converter 101. In one example, the switching cycle time T may be representative of a sum of turn ON and turn OFF times of the switches $T_1$-$T_8$ 128-142 and a delta time. In one example, the delta time may be a time period during which the current in the electronic switches $T_1$-$T_8$ 128-142 attains a zero value. Additionally, the controller 112 may also determine the effective inductance L in the power converter 101 for each of a determined number of switching cycle times T of the power converter 101. In one example, the controller 112 may determine the effective inductance corresponding to ten (10) switching cycle times T of the power converter 101. Furthermore, the controller 112 may compute an average inductance $L_{avr}$ based on the determined inductance L of each of the determined number of switching cycle times T. It may be noted that the terms "switching cycle," "switching period," and "switching time" may be used interchangeably. The aspect of determining the effective inductance in the power converter 101 will be described in greater detail with reference to FIGS. 2 and 3.

Upon computing the average inductance $L_{avr}$, the controller 112 may correct or adjust turn ON and/or turn OFF times of the electronic switches $T_1$-$T_8$ 128-142 based on the average inductance $L_{avr}$ in the power converter 101. In one example, the turn ON and turn OFF times are initially determined based on the inductance value provided by the manufacturer or based on a pre-stored inductance value. However, if this inductance value is different from the computed average inductance $L_{avr}$, the controller 112 may determine that the turn ON and turn OFF times are incorrect. Also, the controller 112 may correct or adjust turn ON and/or turn OFF times of the electronic switches $T_1$-$T_8$ 128-142 based on the average inductance $L_a$, to reduce switching losses in the power converter 101. Subsequently, the controller 112 may transmit the trigger voltages $V_{g1}$, $V_{g2}$, $V_{g3}$, $V_{g4}$, $V_{g5}$, $V_{g6}$, $V_{g7}$, $V_{g8}$ to respective electronic switches $T_1$-$T_8$ 128-142 based on the corrected turn ON and/or turn OFF time of the electronic switches $T_1$-$T_8$ 128-142. Use of the adjusted/corrected turn ON and/or turn OFF times reduces switching losses in the power converter 101. Also, the power converter 101 delivers the power output to the electric load 104 without any additional power drop in the potential power output of the power converter 101. Moreover, implementing the exemplary power converter 101 as depicted in FIG. 1 aids in accurately determining the power output of the power converter 101 and delivering the power output to one or more electrical loads 104.

Figure 2:
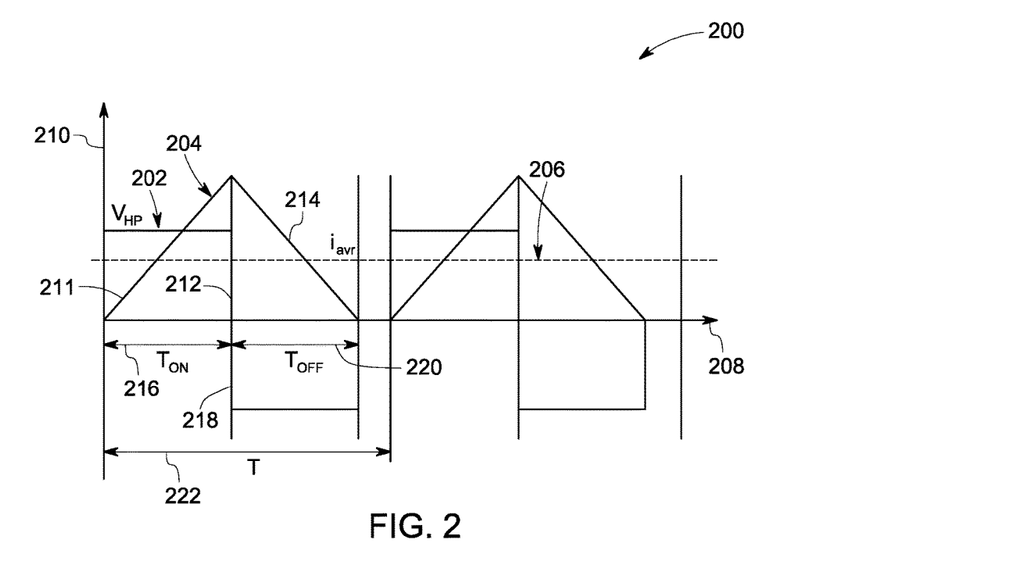
FIG. 2 is a diagrammatical representation of current and voltage waveforms of the power converter of FIG. 1, in accordance with aspects of the present specification.

Referring to FIG. 2, a graphical representation 200 of current and voltage waveforms of the system 100 of FIG. 1, in accordance with aspects of the present specification, is depicted. In accordance with aspects of the present specification, the current and voltage waveforms are used to determine/estimate an inductance of the power converter 101. For ease of understanding, the current and voltage waveforms are described with reference to components of FIG. 1.

Reference numeral 202 represents a waveform of the primary bridge voltage $V_{Hp}$ across the primary bridge unit 106. Similarly, reference numeral 204 represents a waveform of an instantaneous current at the output terminals 162 of the primary bridge unit 106. Further, reference numeral 206 represents a waveform of an average current $i_{avr}$ in the power converter 101. Also, reference numeral 208 represents an X-axis that is indicative of the switching cycle time T of the power converter 101. In a similar manner, reference numeral 210 represents a Y-axis that is indicative of an amplitude of the primary bridge voltage $V_{Hp}$ 202 and the instantaneous current 204 in the power converter 101.

As previously noted, the power converter 101 may be operated in a start-up mode or a normal mode. Accordingly, the system 100 is configured to determine the effective inductance of the power converter 101 when the power converter 101 is operating in the start-up mode and in the normal mode. It may be noted that the terms "effective inductance" and "inductance" may be used interchangeably in the following description. In the start-up mode, the system 100 may determine the effective inductance based on a peak current or an average current in the power converter 101. It may be noted that a start-up procedure followed in the start-up mode will be described in greater detail with reference to FIG. 4. Further, in the normal mode, the system 100 may determine the effective inductance based only on the peak current in the power converter 101.

During the start-up mode of operation of the power converter 101, the controller 112 may transmit/communicate the trigger voltages $V_{g5}$ and $V_{g7}$ to the corresponding electronic switches $T_5$ 136 and $T_7$ 140 to turn ON/activate the electronic switches $T_5$ 136 and $T_7$ 140. Similarly, the controller 112 may transmit the trigger voltages $V_{g6}$ and $V_{g8}$ to the electronic switches $T_6$ 138 and $T_8$ 142 to turn OFF/deactivate the electronic switches $T_6$ 138 and $T_8$ 142. By activating the electronic switches $T_5$ 136 and $T_7$ 140 and deactivating the electronic switches $T_6$ 138 and $T_8$ 142, the secondary winding 118 of the transformer 110 may be short-circuited.

In addition, the controller 112 may transmit the trigger voltages $V_{g1}$ and $V_{g4}$ to the electronic switches $T_1$ 128 and $T_4$ 134 to turn ON/activate these electronic switches $T_1$ 128 and $T_4$ 134. Similarly, the controller 112 may transmit the trigger voltages $V_{g2}$ and $V_{g3}$ to the electronic switches $T_2$ 130 and $T_3$ 132 to turn OFF/deactivate the electronic switches $T_2$ 130 and $T_3$ 132. Activation of the electronic switches $T_1$ 128, $T_4$ 134 and deactivation of the electronic switches $T_2$ 130, $T_3$ 132 may create a first current loop during the turn ON time of the electronic switches $T_1$ 128, $T_4$ 134 and a second current loop during the turn OFF time of the electronic switches $T_1$ 128, $T_4$ 134. The first current loop may enable the current to flow from the voltage source 102 through the electronic switch $T_1$ 128, the electrical cable 114, the primary winding 116 of the transformer 110, the electrical cable 114, the electronic switch $T_4$ 134, and back to the voltage source 102. Also, as the current in the first current loop flows through the primary winding 116, an electrical current is induced in the secondary winding 118 of the transformer 110. Further, this current may flow from the secondary winding 118 through the electrical cable 114, the diode 152, the electronic switch $T_7$ 140, the electrical cable 114, and back to the secondary winding 118.

Further, the current in the first current loop may ramp-up linearly and is represented by a ramp-up line 211 in FIG. 2. Also, the primary bridge voltage $V_{Hp}$ 202 in this phase is represented by a positive half cycle 212 in the voltage waveform 202. Moreover, the turn ON time $T_{on}$ corresponding to the electronic switches $T_1$ 128, $T_4$ 134 is represented by a reference numeral 216.

Similarly, the second current loop may enable the current to flow from the voltage source 102, through the diode 146, the electrical cable 114, the primary winding 116, the electrical cable 114, the diode 148, and back to the voltage source 102. Also, as the current in the second current loop flows through the primary winding 116, an electrical current is induced in the secondary winding 118 of the transformer 110. This current may flow from the secondary winding 118 through the electrical cable 114, the diode 152, the electronic switch $T_7$ 140, the electrical cable 114, and back to the secondary winding 118

Moreover, the current in the second current loop may ramp-down linearly and is represented by a ramp-down line 214 in FIG. 2. Also, the primary bridge voltage $V_{Hp}$ 202 in this phase is represented by a negative half cycle 218 in the voltage waveform 202. Also, the turn OFF time $T_{off}$ corresponding to the electronic switches $T_1$ 128, $T_4$ 134 is represented by a reference numeral 220.

In one embodiment, the controller 112 may determine the effective inductance based on a peak current in the power converter 101. Particularly, the controller 112 may determine a peak current $i_1$ based on a gradient of the instantaneous current. More specifically, the controller 112 may monitor the gradient of the instantaneous current at the primary winding 116 or the secondary winding 118 of the transformer 110. Further, the controller 112 may identify a change in the gradient of the instantaneous current. In one example, the change in the gradient of the instantaneous current may be representative of a change in a value of the instantaneous current from a positive value to a negative value or vice-versa. The controller 112 may determine a value of the instantaneous current that corresponds to the identified change in the gradient of the instantaneous current. Also, the controller 112 may assign the determined value to the peak current $i_1$.

In addition to determining the peak current $i_1$, the controller 112 may measure the primary voltage $V_p$ across the voltage source 102. In one example, the controller 112 may use a voltage sensor to measure the primary voltage $V_p$. Further, the controller 112 may determine the effective inductance L based on the peak current $i_1$, the primary voltage $V_p$, and the turn ON time of the electronic switches $T_1$ 128, $T_4$ 134. Accordingly, in one example, the effective inductance L is determined by using equation (1).

$$L = \frac{V_p}{i_1} T_{on} \qquad (1)$$

In equation (1), $i_1$ represents the measured peak current in the power converter 101, $V_p$ represents the measured primary voltage in the power converter 101, and $T_{on}$ represents the turn ON time of the electronic switches $T_1$ 128, $T_4$ 134.

In another embodiment, the controller 112 may be configured to determine the effective inductance L in the power converter 101 based on the average current $i_{avr}$ in the power converter 101. In this example, the controller 112 may determine the average current based on a plurality of values of the instantaneous current that corresponds to the switching cycle time T of the power converter 101. More specifically, the controller 112 may integrate the plurality of values of the instantaneous current corresponding to the switching cycle time T of the power converter to compute an average value of the instantaneous current corresponding to the switching cycle time T. Further, the controller 112 may assign this computed average value to the average current $i_{avr}$ in the power converter 101. In one example, the controller 112 may include an integrator that is activated at the beginning of the switching cycle time T to accumulate the values of the instantaneous current. Further, the integrator is deactivated at the end of the switching cycle time T. The accumulated values of the instantaneous current within the switching cycle time T may be used to determine an average current $i_{avr}$ in the power converter 101. In one embodiment, the controller 112 may include a voltage controller oscillator (VCO) unit that is used to determine the average current $i_{avr}$ in the power converter 101.

Further, the controller 112 may determine the effective inductance L based on the average current $i_{avr}$, the primary voltage $V_p$, the switching cycle time T of the power converter 101, and the turn ON time of the electronic switches $T_1$ 128, $T_4$ 134. Accordingly, in one example, the controller 112 may determine the effective inductance L based on equation (2).

$$L = \frac{V_p}{i_{avr}} \frac{T_{on}^2}{T} \qquad (2)$$

In equation (2), L represents the effective inductance in the power converter 101, $V_p$ represents the primary voltage of the power converter 101, $i_{avr}$ represents the determined average current in the power converter 101, $T_{on}$ represents the turn ON time of the electronic switches $T_1$ 128, $T_4$ 134, and T represents the switching period of the power converter 101. It may be noted that the controller 112 may determine the effective inductance L by using any one or both of the equations (1) and (2).

In the embodiment of the normal mode of the power converter 101, the controller 112 may determine the effective inductance L based on two subsequent current values $i_{k-1}$ and $i_k$ in the power converter 101. The current values $i_{k-1}$ and $i_k$ may be instantaneous current and/or peak current in the power converter 101. Particularly, the controller 112 may measure a first current value $i_{k-1}$ at a first time $t_{k-1}$ and a second current value $i_k$ at a second time $t_k$ in the power converter 101. The first time $t_{k-1}$ and the second time $t_k$ may be two different time points within the switching cycle time (T). In one example, the first current value $i_{k-1}$ may correspond to the instantaneous current having a zero value at the beginning or the first time $t_{k-1}$ of the switching cycle time (T) time, while the second current value $i_k$ may correspond to the instantaneous current having a peak current value at the second time $t_k$. In another example, the first current value $i_{k-1}$ may correspond to the instantaneous current having a first peak current value, while the second current value $i_k$ may correspond to the instantaneous current having a second peak current value.

More specifically, in the normal mode, the secondary winding 118 of the transformer 110 may be electrically coupled to the electric load 104 via the secondary bridge unit 108 and the electrical cables 114. In one example, the controller 112 may convey trigger voltages $V_{g5}$ and $V_{g8}$ to the electronic switches $T_5$ 136 and $T_8$ 142 to turn ON/activate the electronic switches $T_5$ 136 and $T_8$ 142. Similarly, the controller 112 may transmit the trigger voltages $V_{g6}$ and $V_{g7}$ to the electronic switches $T_6$ 138 and $T_7$ 140 to turn OFF/deactivate the electronic switches $T_6$ 138 and $T_7$ 140. By activating the electronic switches $T_5$ 136 and $T_8$ 142 and deactivating the electronic switches $T_6$ 138 and $T_7$ 140, the secondary winding 118 of the transformer 110 may be electrically coupled to the electric load 104. It may be noted that the turn ON and turn OFF of the electronic switches $T_1$-$T_4$ 128-134 in the primary bridge unit 106 may be maintained similar to the turn ON and turn OFF of the electronic switches in the start-up mode of the power converter 101.

Further, in the normal mode of operation of the power converter 101, the controller 112 may determine the effective inductance L based on two subsequent current values $i_{k-1}$ and $i_k$ in the power converter 101. In particular, the controller 112 may determine the effective inductance L based on the first current value $i_{k-1}$ at the first time $t_{k-1}$ and the second current value $i_k$ at the second time $t_k$, the primary voltage $V_p$, and the secondary voltage $V_s$. Accordingly, in one example, the effective inductance L is determined by using equation (3).

$$L = \frac{V_P - V_S}{i_k - i_{k-1}}(t_k - t_{k-1}) \quad (3)$$

In equation (3), $i_{k-1}$ represents the first current value at the first time $t_{k-1}$, $i_k$ represents the second current value at the second time $t_k$, $V_p$ represents the primary voltage in the power converter 101, and $V_s$ represents the secondary voltage in the power converter 100. Thus, the exemplary power converter 101 of FIG. 1 is capable of determining the effective inductance L based on the peak current and/or the instantaneous current in the normal mode and based on the average or peak current in the start-up mode.

Subsequent to determining the effective inductance L corresponding to one switching cycle T of the power converter 101, the controller 112 may compute an average inductance $L_{avr}$ in the power converter 101. More specifically, the controller 112 may determine the effective inductance L in the power converter 101 for each of a determined number of switching cycle times (T) of the power converter 101. In one example, the controller 112 may determine the inductance corresponding to ten switching cycle times T of the power converter 101. Furthermore, the controller 112 may compute the average inductance $L_{avr}$ based on the effective inductance L corresponding to each of the determined number of switching cycle times. It may be noted that the average inductance $L_{avr}$ may be computed to obtain a statistically better estimate of the effective inductance of the power converter 101. For example, by computing the average inductance $L_{avr}$, effects of measurement noise and computation quantization effects on the effective inductance L of the power converter 101 may be reduced.

Also, in one embodiment, for subsequent operation of the power converter 101, the average inductance $L_{avr}$ in the power converter 101 may be used to control and/or adjust the turn ON time and turn OFF time of the electronic switches in the power converter 101. This in turn may aid in attaining the power transfer of the power converter 101 to a desired value. In one example, the computed average inductance $L_{avr}$ may be used instead of a prior value of the effective inductance or the manufacturer supplied inductance $L_m$ to control and/or adjust the turn ON time and turn OFF time of the electronic switches in the power converter 101.

Further, in the example of FIG. 2, the inductance L in the power converter 101 is determined based on the primary voltage $V_p$ in the power converter 101. However, during operation of the power converter, the power converter 101 may have additional voltage drops, such as a first voltage drop across the primary bridge unit 106 and a second voltage drop across the secondary bridge unit 108 in the power converter 101. In one example, the first and second voltage drops across the primary and secondary bridge units 106, 108 may be due to parasitic inductance and/or impedance in the electronic switches $T_1$-$T_8$ 128-142 and the diodes 144-158 used in the primary and secondary bridge units 106, 108. Hence, it is desirable to account for the first and second voltages drops along with the primary voltage $V_p$ while determining the effective inductance L of the power converter 101. The aspect of determining the effective inductance L based on the first and second voltage drops along with the primary voltage $V_p$ will be described in greater detail with reference to FIG. 3.

Figure 3:
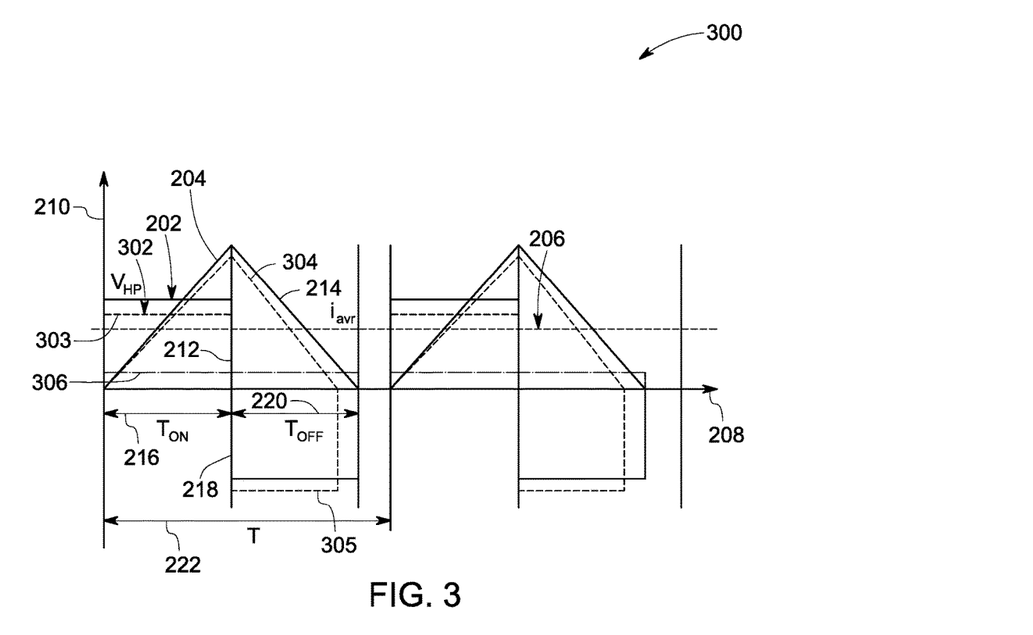
FIG. 3 is another diagrammatical representation of current and voltage waveforms of the power converter of FIG. 1, in accordance with other aspects of the present specification.

Turning now to FIG. 3, a graphical representation 300 of current and voltage waveforms of the power converter 101 of FIG. 1, in accordance with other aspects of the present specification, is depicted. For ease of understanding, the current and voltage waveforms are described with reference to the components of FIGS. 1 and 2.

It may be noted that the waveforms in FIG. 3 are similar to the waveforms of FIG. 2. However, FIG. 3 includes additional voltage and current waveforms 302, 304 that are indicative of the parasitic inductance and additional voltage drops across the electronic switches and diodes in the primary and secondary bridge units 106, 108. Accordingly, in the embodiment of FIG. 3, the voltage and current waveforms 302, 304 representative of parasitic inductance are also used for determining/estimating the effective inductance of the power converter 101.

Moreover, the voltage waveform 302 is based on the primary voltage $V_p$ and a first voltage drop across the primary bridge unit 106 of the power converter 101. The first voltage drop may represent a voltage across the electronic switches T₁ 128, T₄ 134 or the diodes 146, 148 in the primary bridge unit 106. Particularly, when the electronic switches T₁ 128, T₄ 134 are turned ON, the first voltage drop is a sum of voltages across the electronic switches T₁ 128 and T₄ 134. This first voltage drop during the turn ON time of the electronic switches T₁ 128 and T₄ 134 is referred to as $2V_{PT}$, while assuming that the two electronic switches T₁ 128 and T₄ 134 behave identically.

Similarly, when the electronic switches T₁ 128 and T₄ 134 are turned OFF, the first voltage drop is a sum of voltages across the diodes 146, 148. This first voltage drop during the turn OFF time of the electronic switches T₁ 128 and T₄ 134 is referred to as $2V_{PD}$. Further, the voltage corresponding to a positive half cycle 303 of the voltage waveform 302 may be represented as $(V_P-2V_{PT})$, while the voltage corresponding to a negative half cycle 305 of the voltage waveform 302 is represented as $(-V_P-2V_{PD})$. Furthermore, as depicted in FIG. 3, an additional current waveform represented by reference numeral 304 is based on the instantaneous current in the power converter 101.

In addition, the graphical representation 300 of FIG. 3 also includes a secondary voltage waveform 306. The secondary voltage waveform 306 represents a voltage across the secondary bridge unit 108. In the embodiment of FIG. 3, this voltage across the secondary bridge unit 108 is referred to as a second voltage drop. Moreover, the second voltage drop is determined after short-circuiting the secondary winding 118 of the transformer 110. More specifically, in the start-up mode, the secondary winding 118 is short-circuited to temporarily exclude the electric load 104 from the power converter 101 while determining the effective inductance L in the power converter 101. In one example, the electronic switches T₅ 136, T₇ 140 are turned ON, while the electronic switches T₆ 138, T₈ 142 are turned OFF to short-circuit the secondary winding 118 of the transformer 110. Further, the second voltage drop is determined by adding/summing the voltage drops across the electronic switches T₅ 136, T₇ 140 that are turned ON and the voltage drops across the diodes 152, 156 of the secondary bridge unit 108. In the embodiment of FIG. 3, the voltage drop across each of the electronic switches T₅ 136 and T₇ 140 is represented as $V_{ST}$, while the voltage drop across each of the diodes 152, 156 is represented as $V_{SD}$.

During operation of the power converter 101, the controller 112 may first determine the effective inductance L in the power converter 101 corresponding to one switching cycle time T 222 of the power converter 101. It may be noted that the operation of the power converter 101 may entail operating the power converter 101 in a start-up mode or a normal mode. In the start-up mode, the controller 112 may determine the effective inductance L based on the peak current or the average current in the power converter 101. However, in the normal mode, the controller 112 may determine the inductance L based only on the peak current in the power converter 101. For ease of understanding, only the operation of the power converter 101 in the start-up mode of the power converter 101 is presented hereinafter.

The controller 112 may determine a peak current $i_1$ based on a gradient of the instantaneous current. More specifically, the controller 112 may monitor the gradient of the instantaneous current to identify a change in the gradient of the instantaneous current. The controller 112 may then determine a value of the instantaneous current that corresponds to the identified change in the gradient of the instantaneous current. Also, the controller 112 may assign the determined value to the peak current $i_1$ in the power converter 101.

Upon determining the peak current $i_1$, the controller 112 may be configured to determine the effective inductance L in the power converter 101 based on the peak current $i_1$. In particular, the controller 112 may determine the effective inductance L by using equation (4) and/or equation (5).

$$L = \frac{V_P - 2V_{PT} - n(V_{ST} + V_{SD})}{i_1} T_{on} \quad (4)$$

$$L = \frac{V_P + 2V_{PD} + n(V_{ST} + V_{SD})}{i_1} T_{off} \quad (5)$$

In equations (4) and (5), $i_1$ represents the determined peak current in the power converter 101, $V_p$ represents the primary voltage in the power converter 101, $V_{PT}$ represents the first voltage drop during the turn ON time 216, $V_{PD}$ represents the first voltage drop during the turn OFF time 220, L represents the estimated effective inductance value, $T_{on}$ represents the turn ON time of the electronic switches T₁ 128, T₄ 134, $T_{off}$ represents the turn OFF time of the electronic switches T₁ 128, T₄ 134, n represents the turn ratio of the transformer 110, $V_{ST}$ represents the voltage drop across the electronic switch T₇ 140, and $V_{SD}$ represents the voltage drop across the diode 152.

In another embodiment, the controller 112 may be configured to determine the effective inductance L in the power converter 101 based on the average current $i_{avr}$ in the power converter 101. Particularly, the controller 112 may determine the average current $i_{avr}$ based on a plurality of values of the instantaneous current that corresponds to the switching cycle time (T) of the power converter 101. More specifically, the controller 112 may integrate the plurality of values of the instantaneous current corresponding to the switching cycle time (T) of the power converter 101 to compute an average value of the instantaneous current corresponding to the switching cycle time (T). Further, the controller 112 may assign this computed average value to the average current $i_{avr}$ in the power converter 101. In one embodiment, the controller 112 may include a voltage controller oscillator (VCO) unit that is used to determine the average current $i_{avr}$ in the power converter 101.

Upon determining the average current $i_{avr}$, the controller 112 may be configured to determine the effective inductance L in the power converter 101 based on the average current $i_{avr}$. In particular, the controller 112 may determine the effective inductance L based on equation (6).

$$L = \frac{V_P - 2V_{PT} - n(V_{ST} + V_{SD})}{i_{avr}} \left(1 + \frac{V_P - 2V_{PT} - n(V_{ST} + V_{SD})}{V_P + 2V_{PD} + n(V_{ST} + V_{SD})}\right) \frac{T_{on}^2}{2T} \quad (6)$$

In equation (6), L represents the effective inductance in the power converter 101, $V_p$ represents the measured primary voltage of the power converter 101, $i_{avr}$ represents the measured average current in the power converter 101, $T_{on}$ represents the turn ON time of the electronic switches T₁ 128, T₄ 134, T represents the switching cycle time of the power converter 101, $V_{PT}$ represents the first voltage drop during the turn ON time, $V_{PD}$ represents the first voltage drop during the turn OFF time, $V_{ST}$ represents the voltage drop across the electronic switch T₇ 140, and $V_{SD}$ represents the voltage drop across the diode 152.

Subsequent to determining the effective inductance L corresponding to one switching cycle T of the power converter 101, the controller 112 may compute an average inductance $L_{avr}$ in the power converter 101. More specifically, the controller 112 may determine the effective inductance L of the power converter 101 for each of a determined number of switching cycle times T of the power converter 101. In one example, the controller 112 may determine the effective inductance for ten (10) switching cycle times T of the power converter 101. Furthermore, the controller 112 may compute the average inductance $L_{avr}$ based on the effective inductance L determined for each of the determined number of switching cycle times T.

Thus, by employing the first and second voltage drops across the primary and secondary bridge units 106, 108, the conduction voltage drops of the semiconductor devices or the electronic switches are also accounted for in the determination/estimation of the effective inductance of the power converter 101. Consequently, a more accurate estimate of the effective inductance of the power converter 101 may be generated. Use of the more accurate estimate of the effective inductance aids in providing a more accurate estimate of the power output of the power converter 101.

Figure 4:
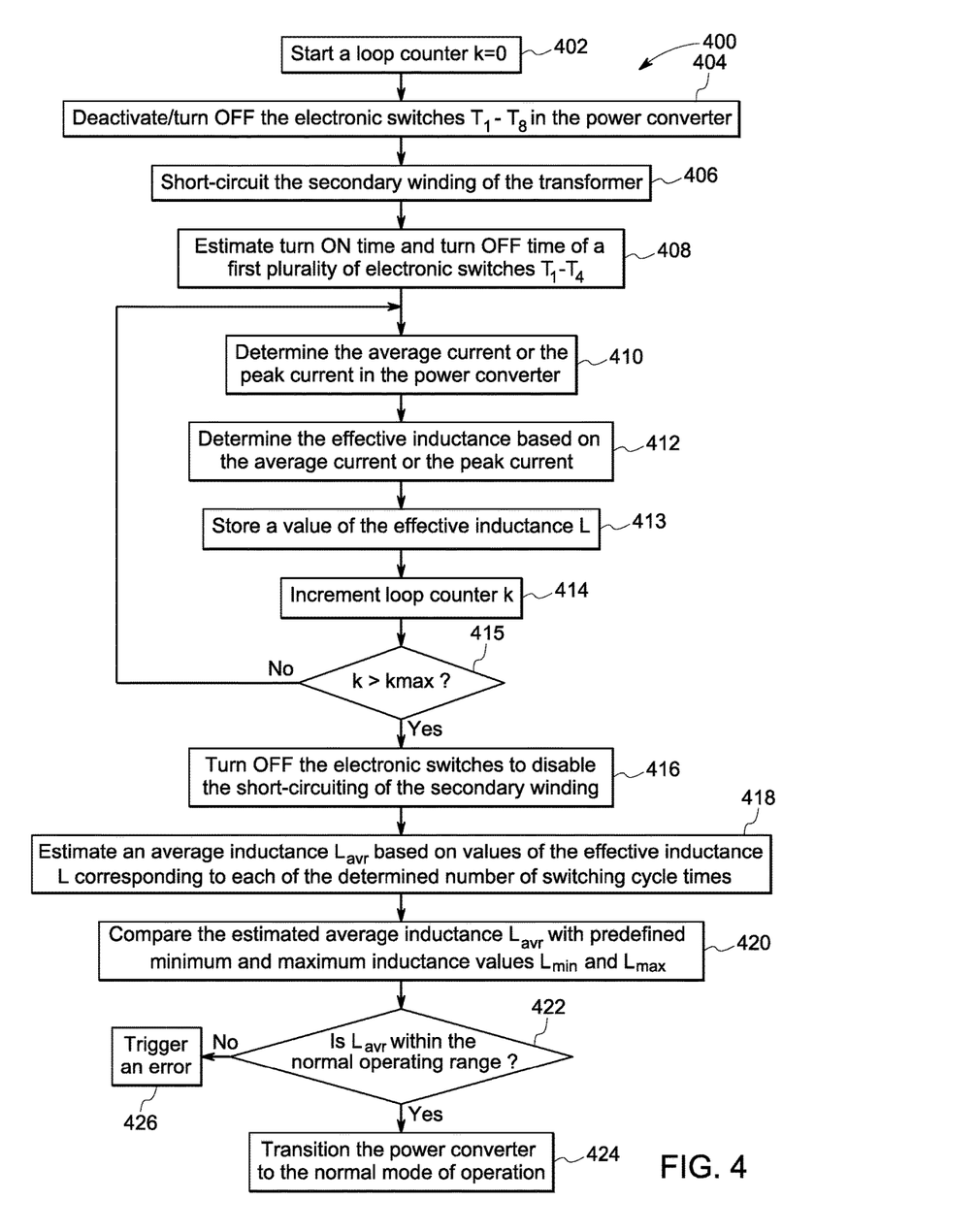
FIG. 4 is a flow chart illustrating a method for determining an effective inductance in the power converter of FIG. 1, in accordance with aspects of the present specification.

Turning now to FIG. 4, a flow chart 400 illustrating a method for determining an effective inductance of a power converter, in accordance with aspects of the present specification, is depicted. For ease of understanding, the method 400 is described with reference to the components of FIGS. 1-3. Also, for ease of understanding, the method 400 is described with reference to a start-up mode of operation of the power converter 101. Similar steps may be employed to determine the effective inductance of the power converter 101 operating in a normal mode.

The method 400 begins with a step 402, where a loop counter k is set to zero. The loop counter k is used to track the number of times the effective inductance L corresponding to the power converter 101 is determined. In certain embodiments, the controller 112 may be used to track the loop counter k.

Subsequently, at step 404, the controller 112 may deactivate/turn OFF the electronic switches $T_1$-$T_8$ 128-142 in the power converter 101. Also, at step 404, the power converter 101 may be coupled to a voltage source 102 to receive a primary voltage $V_p$.

Furthermore, at step 406, the controller 112 may turn ON the electronic switches $T_5$ 136, $T_7$ 140 and turn OFF the electronic switches $T_6$ 138, $T_8$ 142 to short-circuit the secondary winding 118 of the transformer 110. More specifically, in the start-up mode, the secondary winding 118 may be short-circuited to temporarily exclude the electric load 104 from the power converter 101 while determining the effective inductance L of the power converter 101.

Additionally, at step 408, the controller 112 may estimate the turn ON time and turn OFF time of a first plurality of electronic switches $T_1$-$T_4$ 128-134. The turn ON time is representative of a time period during which the electronic switches $T_1$-$T_4$ 128-134 are activated. Similarly, the turn OFF time is representative of a time period during which the electronic switches $T_1$-T4 128-134 are deactivated. In one embodiment, the turn ON time and turn OFF time may be computed based on an inductance value $L_m$ provided by the manufacturer. For example, the controller 112 may compute the turn ON time by multiplying the inductance value $L_m$ provided by the manufacturer with a determined value, such as 0.8. Also, the controller 112 may ensure that the computed turn ON time does not impact current conduction in the power converter 101. In addition, the controller 112 may also ensure that the computed peak current in the power converter 101 does not adversely impact the components in the power converter 101. Moreover, the turn ON time and turn OFF time are determined in such a way that the current starts at a zero value at the beginning of the switching cycle time T and ends at a zero value before or at the end of the switching cycle time T as depicted in FIG. 2 and FIG. 3. In one embodiment, the effective inductance L determined in a current switching cycle time T may be used for computing the turn ON time and turn OFF time for a subsequent switching cycle time T or during operation of the power converter 101 after a certain time period.

Subsequently at step 410, the controller 112 may be configured to turn ON and turn OFF the electronic switches $T_1$-$T_4$ 128-134 of the primary bridge unit 106 based on the determined turn ON time and turn OFF time. Also, at step 410, the controller 112 may determine the average current $i_{avr}$ and the primary voltage $V_P$ of the power converter 101. In one example, the controller 112 may determine a plurality of values of the instantaneous current corresponding to a determined number of switching cycle times T of the power converter 101. Subsequently, the controller 112 may integrate the plurality of values of the instantaneous current to compute an average value of the instantaneous current corresponding to the switching cycle time T. Further, this average value may be assigned to the average current $i_{avr}$ in the power converter 101. Alternatively, at step 410, the controller 112 may determine the peak current $i_1$ in the power converter 101. In one example, the controller 112 may determine the peak current $i_1$ based on a change in a gradient of the instantaneous current in the power converter 101.

Furthermore, at step 412, the controller 112 may determine the effective inductance L of the power converter 101 based on the primary voltage $V_p$, the determined turn ON time $T_{on}$ of the first plurality of electronic switches $T_1$-$T_4$ 128-134, the switching cycle time T of the power converter 101, and the determined average current $i_{avr}$ in the power converter 101. In one example, the controller 112 may determine the effective inductance L by using equation (6). Alternatively, at step 412, the controller 112 may determine the effective inductance of the power converter 101 based on the primary voltage $V_p$, the determined turn ON time $T_{on}$ of the first plurality of electronic switches $T_1$-$T_4$ 128-134, the switching cycle time T of the power converter 101, and the determined peak current $i_1$ in the power converter 101. In one example, the controller 112 may determine the effective inductance L by using equation (4) or equation (5).

Additionally, at step 413, the controller 112 may store a value of the effective inductance L for each switching cycle time T. In one example, the controller 112 may store a value of the effective inductance L in a memory disposed within the controller 112.

Subsequently, the controller 112 may increment the loop counter k when the controller 112 stores the value of the effective inductance L for each switching cycle time T, as depicted by step 414. Further, at step 415, the controller 112 may verify whether a value in the loop counter k exceeds a determine threshold value $k_{max}$. The determined threshold value $k_{max}$ may be representative of a maximum number of switching cycle times (T). In one example, the determined threshold value $k_{max}$ may have a value of ten (10). Accordingly, at step 415, if the loop counter k has a value lower than that of the determined threshold value $k_{max}$, control is passed back to step 410 where the controller 112 continues to determine and store the effective inductance L for subsequent switching cycle times (T). However, at step 415, if it is verified that the loop counter k exceeds the determined threshold value $k_{max}$, control is passed to step 416.

Further, at step 416, the controller 112 may turn OFF the electronic switches $T_1$-$T_8$ 128-142 in the power converter 101 to disable the short-circuiting of the secondary winding 118 of the transformer 110 and to ensure safe transition of the power converter 101 from the start-up mode to the normal mode of operation. Also, at step 418, the controller 112 may estimate an average inductance $L_{avr}$ based on the effective inductance values L corresponding to each of the determined number of the switching cycle times T.

Subsequently, at step 420, the controller 112 may compare the estimated average inductance $L_{avr}$ with predefined minimum and maximum inductance values $L_{min}$ and $L_{max}$. In one example, the minimum and maximum inductance values $L_{min}$ and $L_{max}$ may correspond to a normal operating range of the power converter 101. Also, this range of the inductance values $L_{min}$ and $L_{max}$ may be used as a health indicator of the determined effective inductance L in the power converter 101. In one embodiment, the average inductance $L_{avr}$ may be compared with corresponding previously determined values of the average inductance $L_{avr}$ to generate an indicator for inductance degradation speed, which in turn may be used to monitor the health of the power converter 101. Additionally, any corrective action/service may be triggered in a timely manner based on the health of the average inductance $L_{avr}$.

Accordingly, at step 422, a check may be carried out to verify if the value of the average inductance $L_{avr}$ is within the normal operating range or in a healthy range. If the value of the average inductance $L_{avr}$ is within the normal operating range or in the healthy range, the controller 112 may transition the power converter 101 from the start-up to the normal mode, as depicted by step 424. However, if it is verified that value of the average inductance $L_{avr}$ is outside the normal operating range, the controller 112 may trigger an error signal or initiate corrective action/services, as indicated by step 426. Optionally, the controller 112 may trigger the error signal or call a technician after repeating steps 402-420 of the start-up mode for a determined number of times. In one example, the determined number of times may be three.

Employing the method 400, the inductance values may be stored to provide a historical trend of the inductance health of the power converter 101. Also, the historical inductance data may be analyzed to provide diagnostics regarding failure and/or life time of the inductor and/or the power converter 101. Also, the inductance values may be used to trigger an error signal or call the technician in case of a discrepancy between an expected value and the measured value of the inductance. In one example, the error signal may indicate the health of the power converter 101.

The various embodiments of the exemplary system and method aid in determining an inductance in the power converter. By determining the inductance in the power converter, the turn ON time and turn OFF time of the electronic switches in the power converter may be adjusted or corrected to match the power transfer of the power converter to a desired value. Also, based on the determined inductance of the power converter, the potential power output of the power converter may be accurately determined and delivered to one or more electrical loads. In addition, the exemplary system and method may account for parasitic inductances while determining the overall inductance in the power converter, thereby providing a robust estimate of the inductance. Moreover, the stored inductance values may provide historical trend of the inductance health. The historical inductance data may be analyzed to provide diagnostic information regarding failure and life time of the inductor and/or the power converter.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system for determining an inductance of a power converter, comprising:
   a power converter comprising:
   a primary bridge unit coupled to a voltage source and configured to receive a primary voltage from the voltage source, wherein the primary bridge unit comprises a first plurality of electronic switches, and wherein each of the first plurality of electronics switches has a turn ON time and a turn OFF time;
   a transformer comprising a primary winding and a secondary winding, wherein the primary winding is coupled to the first plurality of electronic switches in the primary bridge unit;
   a secondary bridge unit comprising a second plurality of electronic switches coupled to the secondary winding of the transformer; and
   a controller configured to
   determine the primary voltage, a switching cycle time of the power converter, the turn ON time, the turn OFF time, an average current and a peak current in the power converter; and
   determine an inductance of the power converter based on the primary voltage, the turn ON time of the first plurality of electronic switches of the primary bridge unit, the switching cycle time of the power converter, and one of the average current and the peak current in the power converter.

2. The system of claim 1, wherein the controller is configured to determine the peak current based on a gradient of an instantaneous current in the power converter.

3. The system of claim 2, wherein the controller is configured to:
   identify a change in the gradient of the instantaneous current;
   determine a value of the instantaneous current corresponding to the identified change in the gradient of the instantaneous current; and
   assign the determined value to the peak current.

4. The system of claim 2, wherein the controller is configured to determine the average current based on a plurality of values of the instantaneous current corresponding to the switching cycle time of the power converter.

5. The system of claim 4, wherein the controller is configured to:
   integrate the plurality of values of the instantaneous current corresponding to the switching cycle time of the power converter to compute an average value of the instantaneous current corresponding to the switching cycle time; and
   assign the computed average value to the average current.

6. The system of claim 1, wherein the controller is configured to determine the inductance of the power converter when the power converter is in a start-up mode of operation.

7. The system of claim 6, wherein the controller, in the start-up mode, is configured to:

activate two of the second plurality of electronic switches to short-circuit the secondary winding of the transformer;
activate two of the first plurality of electronic switches for the turn ON time; and
determine the inductance of the power converter based on one of the average current and the peak current in the power converter.

8. The system of claim 7, wherein the controller is configured to deactivate the first plurality of electronic switches and the second plurality of electronic switches in the power converter prior to short-circuiting the secondary winding of the transformer.

9. The system of claim 1, wherein the controller is configured to determine the inductance of the power converter when the power converter is in a normal mode of operation.

10. The system of claim 9, wherein the controller, in the normal mode, is configured to:
couple the secondary winding of the transformer to an electric load via the second plurality of electronic switches;
activate two of the first plurality of electronic switches for the turn ON time;
activate two of the second plurality of electronic switches for the turn ON time; and
determine the inductance of the power converter based on the peak current in the power converter.

11. The system of claim 1, wherein the controller is configured to determine the inductance of the power converter corresponding to each of a determined number of switching cycle times.

12. The system of claim 11, wherein the controller is configured to estimate an average inductance based on the inductance corresponding to each of the determined number of the switching cycle times.

13. The system of claim 12, wherein the controller is configured to:
compare the estimated average inductance with a normal operating range of the power converter; and
trigger an error signal based on the comparison.

14. A method for determining an inductance of a power converter, the method comprising:
receiving, by a primary bridge unit, a primary voltage from a voltage source, wherein the primary bridge unit comprises a first plurality of electronic switches having a turn ON time and a turn OFF time;
determining, by a controller, the primary voltage, a switching cycle time of the power converter, the turn ON time, the turn OFF time, an average current and a peak current in the power converter; and
determining, by the controller, an inductance of the power converter based on the primary voltage, the turn ON time of the first plurality of electronic switches of the primary bridge unit, a switching cycle time of the power converter, and one of an average current and a peak current in the power converter.

15. The method of claim 14, further comprising short-circuiting a secondary winding of a transformer prior to determining the inductance of the power converter.

16. The method of claim 14, further comprising determining the peak current based on a gradient of an instantaneous current in the power converter.

17. The method of claim 16, wherein determining the peak current comprises:
identifying a change in the gradient of the instantaneous current;
determining a value of the instantaneous current corresponding to the identified change in the gradient of the instantaneous current; and
assigning the determined value to the peak current in the power converter.

18. The method of claim 16, further comprising determining the average current based on a plurality of values of the instantaneous current corresponding to the switching cycle time of the power converter.

19. The method of claim 18, wherein determining the average current comprises:
integrating the plurality of values of the instantaneous current corresponding to the switching cycle time of the power converter to compute an average value of the instantaneous current corresponding to the switching cycle time; and
assigning the computed average value to the average current in the power converter.

20. The method of claim 14, further comprising:
determining the inductance of the power converter corresponding to each of a determined number of switching cycle times; and
estimating an average inductance based on the inductance corresponding to each of the determined number of the switching cycle times.

21. The method of claim 20, further comprising determining the inductance of the power converter in a start-up mode, a normal mode, or a combination thereof.

22. The method of claim 21, further comprising:
comparing the estimated average inductance with a normal operating range of the power converter; and
performing one of transitioning the power converter from the start-up mode to the normal mode if the estimated average inductance is within the normal operating range of the power converter and triggering an error signal if the estimated average inductance is outside the normal operating range of the power converter.

23. A system, comprising:
a power converter comprising:
a primary bridge unit coupled to a voltage source, wherein the primary bridge unit comprises a first plurality of electronic switches;
a transformer comprising a primary winding and a secondary winding, wherein the primary winding is coupled to the first plurality of electronic switches in the primary bridge unit; and
a secondary bridge unit comprising a second plurality of electronic switches coupled to the secondary winding of the transformer; and
a controller coupled to the power converter and configured to:
determine a number of switching cycle times of the power converter;
determine an inductance of the power converter corresponding to each of the determined number of switching cycle times;
estimate an average inductance based on the inductance corresponding to each of the determined number of the switching cycle times;
compare the estimated average inductance with a normal operating range of the power converter; and
trigger an error signal based on the comparison, wherein the error signal is an indicator of health of the power converter.

24. The system of claim 23, wherein the controller is configured to transition the power converter from a start-up mode to a normal mode if the estimated average inductance is within the normal operating range of the power converter.

* * * * *